(12) United States Patent
Tanaka et al.

(10) Patent No.: US 7,555,406 B2
(45) Date of Patent: Jun. 30, 2009

(54) METHOD OF MAINTAINING AND AUTOMATICALLY INSPECTING PROCESSING APPARATUS

(75) Inventors: Hisato Tanaka, Yamanashi (JP); Akira Obi, Yamanashi (JP); Akira Iwami, Yamanashi (JP); Kazushi Tahara, Yamanashi (JP); Shigeaki Kato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 766 days.

(21) Appl. No.: 10/986,310

(22) Filed: Nov. 12, 2004

(65) Prior Publication Data

US 2005/0090927 A1    Apr. 28, 2005

Related U.S. Application Data

(62) Division of application No. 10/332,126, filed as application No. PCT/JP01/05787 on Jul. 4, 2001, now Pat. No. 6,954,716.

(30) Foreign Application Priority Data

| Jul. 7, 2000 | (JP) | ............................. 2000-206430 |
| Jul. 24, 2000 | (JP) | ............................. 2000-222615 |
| Jul. 24, 2000 | (JP) | ............................. 2000-222622 |

(51) Int. Cl.
*G06F 11/34* (2006.01)

(52) U.S. Cl. .................................................. 702/183

(58) Field of Classification Search .................. 702/32, 702/35, 36, 40, 81–84, 118, 183–185; 438/6
See application file for complete search history.

(56) References Cited

U.S. PATENT DOCUMENTS

| 4,618,938 | A | | 10/1986 | Sandland et al. |
| 5,220,517 | A | | 6/1993 | Sierk et al. |
| 5,321,828 | A | * | 6/1994 | Phillips et al. ................ 703/28 |
| 5,859,698 | A | | 1/1999 | Chau et al. |
| 5,983,366 | A | * | 11/1999 | King ............................ 714/38 |
| 6,233,676 | B1 | * | 5/2001 | Henry et al. ................ 712/233 |

(Continued)

FOREIGN PATENT DOCUMENTS

EP    0 847 076 A2    6/1998

(Continued)

OTHER PUBLICATIONS

European Search Report.

*Primary Examiner*—Edward Raymond
*Assistant Examiner*—Mohamed Charioui
(74) *Attorney, Agent, or Firm*—Finnegan, Henderson, Farabow, Garrett & Dunner, L.L.P.

(57) ABSTRACT

According to the present invention, as processing apparatus drive starts, the operating state of software used to drive the processing apparatus is monitored in real time to diagnose whether or not an abnormality has occurred (S110). If it is judged through the diagnosis performed in S110 that no abnormality has occurred, the workpiece processing is allowed to continue uninterrupted and then a decision is made as to whether or not the workpiece processing has been completed (S130). If the processing has been completed, the processing apparatus is stopped (S140). If, on the other hand, it is judged through the diagnosis performed in S110 that an abnormality has occurred, a log of the diagnosis item with regard to which the abnormality has occurred is recorded (S120). The processing apparatus is then stopped (S140).

5 Claims, 12 Drawing Sheets

U.S. PATENT DOCUMENTS 6,745,094 B1 * 6/2004 Harakawa et al. .......... 700/121

FOREIGN PATENT DOCUMENTS

| | | |
|---|---|---|
| JP | 04-364752 | 12/1992 |
| JP | 11-016798 | 1/1999 |
| JP | 11-204390 | 7/1999 |
| JP | 11-238659 | 8/1999 |
| JP | 11-243041 | 9/1999 |
| WO | WO 98/57358 | 12/1998 |

* cited by examiner (a)

(b)

METHOD OF MAINTAINING AND AUTOMATICALLY INSPECTING PROCESSING APPARATUS

CLAIM OF PRIORITY

This is a division of application Ser. No. 10/332,126, filed on Jan. 6, 2003, now U.S. Pat. No. 6,954,716 and claiming priority to international application PCT/JP01/05787, filed on Jul. 4, 2001, both of which are incorporated herein by reference.

TECHNICAL FIELD

The present invention relates to a processing apparatus that executes processing such as etching and film formation on a workpiece which may be a semiconductor wafer or a liquid crystal display substrate and, more specifically, it relates to a method of self-diagnosing software used to drive the processing apparatus, a method of maintaining the processing apparatus, a method of automatically inspecting the processing apparatus and a method of automatically resetting the processing apparatus.

BACKGROUND ART

Semiconductor devices are processed through various steps such as etching, film formation, ashing and sputtering, and these steps are executed by employing various types of semiconductor processing apparatuses. In this type of semiconductor processing application, a so-called cluster multi-chamber processing apparatus is widely utilized in the related art so that a plurality of types of processing can be executed in single apparatus. Such a processing apparatus having a plurality of vacuum processing chambers connected to a common transfer chamber so as to allow a substrate being processed, i.e., a semiconductor wafer, to be carried into/out of a loading/unloading chamber connected to the transfer chamber via an auxiliary vacuum chamber achieving a load lock function is ideal for achieving higher integration in the semiconductor device and a higher throughput and effectively prevents contamination of the workpiece.

If a failure occurs in this type of processing apparatus (hereafter it may also be referred to simply as a processing apparatus) capable of performing various types of processing, the processing apparatus must be stopped over an extended period of time for repairs, which results in a lower throughput. In order to improve the yield of semiconductors being processed and sustain a specific level of throughput by preventing failures of the processing apparatus, it is essential to perform proper maintenance of the parts constituting the processing apparatus. In the related art, various operations of the processing apparatus, which constitute the items to be checked for maintenance, are tested and processing apparatus inspection data are collected in conformance to a program prepared in advance.

However, whenever the contents of a processing apparatus operation test or details regarding the acquisition of the processing apparatus inspection data change, then the program needs to be modified or either the test or the acquisition of the inspection data on the relevant item needs to be conducted through a manual operation. Such a process is bound to be extremely complicated and time-consuming with a significant number of procedural steps to be followed. While Japanese Patent Laid-Open Publication No. 4-364752 discloses a semiconductor substrate processing system which allows the order in which semiconductor wafers are transferred to be set freely, it is desirable to allow processing apparatus operations other than the semiconductor wafer transfer to be set freely as well.

A first object of the present invention, which has been completed by addressing the problems discussed above, is to provide a method of maintaining a processing apparatus capable of executing processing apparatus operations in any combination.

In addition, since the processing apparatus described above is normally operated under critical conditions and the yield of finished products can be readily lowered by a slight abnormality or a minor incidence of contamination, it must be inspected and maintained on a regular basis. The regular inspection and maintenance work is implemented, for instance, once a day on a semiconductor wafer processing apparatus and, and accordingly, it is desirable to automate the regular inspection process and in order to carry out the processes with higher reliability and higher efficiency.

The inspection items to be checked during an inspection include those that cannot be checked while the processing apparatus is engaged in operation and thus, need to be checked by stopping the processing apparatus. Accordingly, each time inspection/maintenance work is implemented, the operator needs to verify the operating state of the processing apparatus, and if the processing apparatus is currently engaged in operation, the operator must wait for the processing apparatus to enter a stopped state or, if necessary, forcibly stop the processing apparatus. In addition, the inspection items also include those that can be checked only by first processing a dummy wafer or the like and then collecting the dummy wafer for measurement, such as particle measurement and film thickness measurement. For these reasons, it is difficult to conduct regular inspection and reset the processing apparatus after the maintenance work completely automatically, and the operator must verify the operating state of the processing apparatus each time inspection or maintenance is to be conducted and perform work manually.

In addition, as increasingly larger wafer and glass substrates are processed, the processing apparatus itself has become larger in recent years, necessitating a greater number of operators to manually perform the inspection and maintenance work and a greater number of works steps to be taken in such manual inspection and maintenance. Since this poses a greater risk of contamination of the clean space, automation of the inspection and maintenance processes has become an even more critical technological objective to be fulfilled.

A second object of the present invention, which has been completed by addressing the problems discussed above, is to provide a new and improved method of automatically inspecting a processing apparatus and a new and improved method of automatically resetting the processing apparatus, through which the operating efficiency of the processing apparatus is improved by automatically inspecting the processing apparatus and automatically resetting the processing apparatus after the maintenance work.

Furthermore, the processing apparatus described above is normally driven by software. However, the operating state of the software driving the processing apparatus is not monitored in the related art. As a result, the processing apparatus is allowed to continue operating until a fatal abnormality occurs in the processing apparatus. Once a failure occurs in this type of apparatus the processing apparatus must be stopped over an extended period of time for repairs to result in lowered throughput. Moreover, the occurrence of an abnormality in the processing apparatus gives rise to another problem in that such an abnormality may result in damaged wafer product.

A third object of the present invention, which has been completed by addressing the problems discussed above, is to provide a method of self-diagnosing software used to drive a processing apparatus, that makes it possible to avert the occurrence of an abnormality in the processing apparatus and prevent damage to the workpiece.

DISCLOSURE OF THE INVENTION

In order to achieve the objects described above, a first aspect of the present invention provides a method of maintaining a processing apparatus comprising a registration step in which unit operations corresponding to individual parts of the processing apparatus undergoing maintenance are registered in advance, a macro writing step in which a maintenance macro for executing the unit operations in units of the individual operations and/or in combination of unit operations through a sequence operation and/or a parallel operation is described and a macro execution step in which maintenance is performed by executing the maintenance macro described in the macro writing step. The method, which only requires simple editing of the existing macro file to reflect any change in the contents of the operation test or the contents of the data to be obtained, eliminates the necessity for preparing a new program from scratch or the necessity of a manual operation.

In addition, the processing apparatus can be evaluated by executing an evaluation step in which the sequence operation and/or the parallel operation executed in the macro execution step is evaluated. It is desirable that the unit operations include inspection of the part undergoing the maintenance and that the unit operations also include an initialization of the part undergoing maintenance.

Furthermore, the macro writing step includes a target monitoring operation macro writing step, in which a macro is written for monitoring whether or not the unit operations of each part undergoing the maintenance have achieved control values, to ensure that the process does not shift to the next operation until a predetermined value is achieved in an operation. In addition, the macro writing step includes a loop macro writing step, in which a macro is written for repeatedly executing a unit operation of the part undergoing the maintenance so as to repeat a specified operation, and in such a case, an endurance test or the like is enabled.

In order to achieve the objects described above, a second aspect of the present invention provides a method of automatically inspecting a processing apparatus that processes a workpiece, comprising a registration step in which at least inspection items to be checked in an inspection process and a time point for the inspection process are registered in advance, a verification step in which the operating state of the processing apparatus is verified when the registered inspection time point arrives, an inspection step in which the inspection is automatically executed to check the registered inspection items immediately if it is decided in the verification step that the processing apparatus is not engaged in operation or after the operation of the processing apparatus ends if it is decided in the verification step that the processing apparatus is engaged in operation and a decision-making step in which a decision is made as to whether or not the inspection process has been completed.

It is desirable that the processing apparatus include as a component thereof an inline inspection device and that some of the inspection items are checked through an inline inspection. In addition, it is desirable that during the inspection step, an abnormality detection response step is executed in which, upon detecting an abnormality, the maintenance personnel is notified of the details of the abnormality and the inspection is interrupted. It is also desirable that the inspection items include at least one of; a target vacuum inspection, a leak inspection, a flow rate inspection, a discharge inspection, a high-frequency power supply system inspection, a plasma light emission inspection, a particle inspection, an etching characteristics inspection, a test transfer and a test wafer processing inspection. Moreover, it is desirable to detect an abnormality during the inspection process and/or to make a decision as to whether or not the inspection has been completed through a multivariate analysis.

In order to achieve the objects described above, a third aspect of the present invention provides a method of automatically resetting a processing apparatus that processes a workpiece, comprising a registration steps in which inspection items and procedures to be taken to check the inspection items are registered in advance, the inspection items including, at least, an inspection item to be checked through an inline inspection when the processing apparatus is reset to a normal operating mode from a maintenance modes, and an automatic resetting step, in which the registered inspection items are automatically checked in conformance to the registered inspection procedures when resetting the processing apparatus from the maintenance mode.

It is desirable that during the automatic resetting step, an abnormality detection response step is executed, in which, upon detecting an abnormality, the maintenance personnel is notified of the details of the abnormality and the inspection is interrupted. It is also desirable that the inspection items include at least one of: a target vacuum inspection, a leak inspection, a flow rate inspection, a discharge inspection, a high-frequency power supply system inspection, a plasma light emission inspection, a particle inspection, an etching characteristics inspection, a test transfer and a test wafer processing inspection. Moreover, it is desirable to detect an abnormality during the inspection process and/or to make a decision as to whether or not the inspection has been completed through a multivariate analysis.

In order to achieve the objects described above, a fourth aspect of the present invention provides a method of self-diagnosing software used to drive a processing apparatus, comprising a monitoring step in which predetermined diagnostic items are checked to monitor in real time the operating state of the software used to drive the processing apparatus and a down processing step in which the processing apparatus is stopped if an abnormality is detected in the software during the monitoring step after recording a log of the diagnostic item with regard to which the abnormality has occurred. By adopting this method, which allows an appropriate action to be taken upon detecting a software abnormality, damage to the processing apparatus or the workpiece, i.e., the product, can be averted. In addition, the recorded log makes it possible to take appropriate action by ascertaining the exact location where the abnormality has occurred and the exact cause of the abnormality.

It is desirable that the diagnostic items include at least one of; the memory state, the CPU load state, the queue state, the number of open files, the network communication load, the stack state and the resource state. The memory state may be ascertained by, for instance, checking the available memory capacity to determine whether or not the available memory is insufficient and the CPU load state may be ascertained by, for instance, detecting whether or not the CPU has sufficient capability for the overall system.

Figure 1:
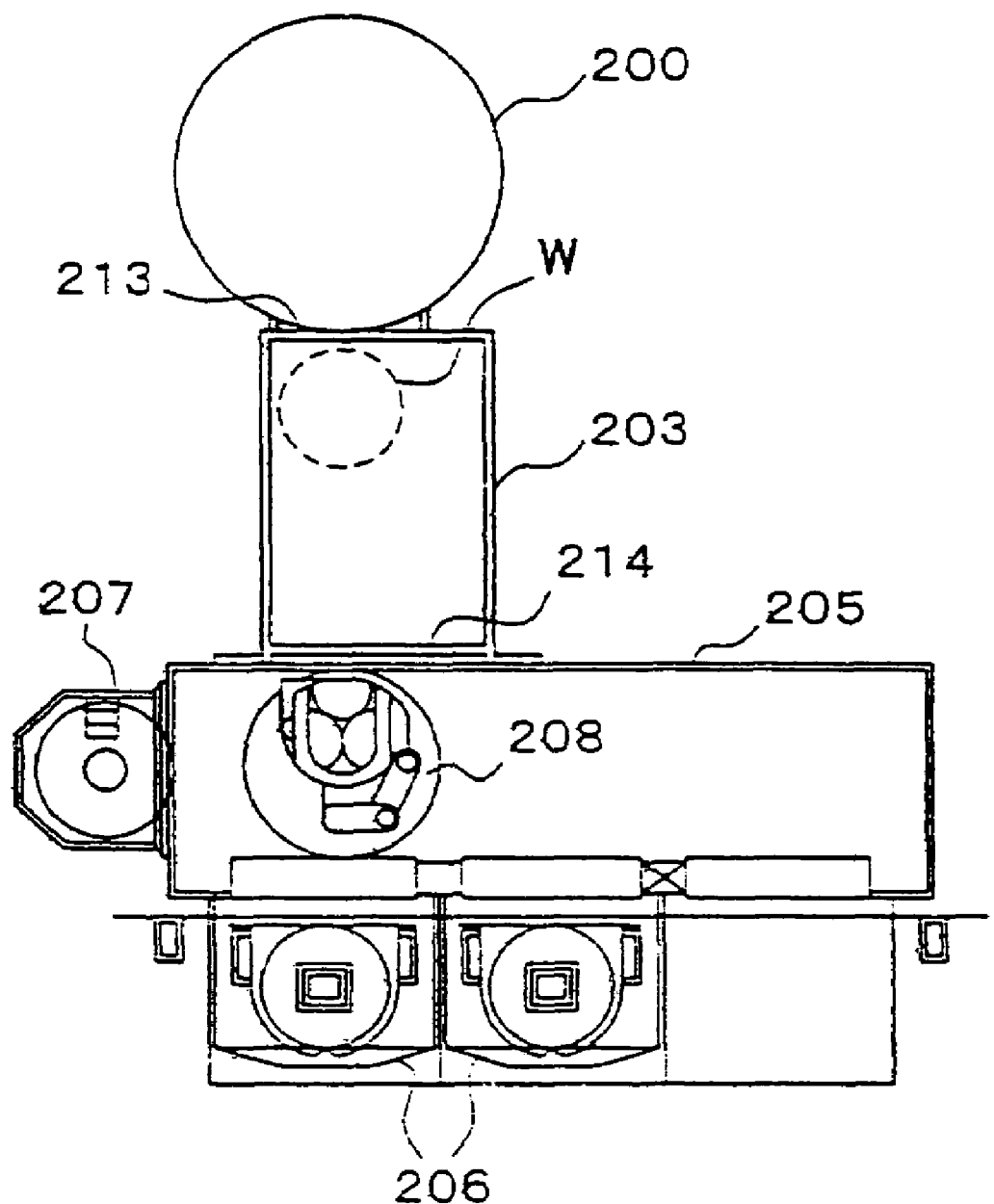
FIG. 1 is a schematic plan view of the semiconductor processing apparatus achieved in a first embodiment of the present invention.

Explanation of Reference Numerals
- 100 processing apparatus
- 102 transfer arm
- 104 vacuum transfer chamber
- 106 first load lock chamber
- 108 second load lock chamber
- 110 first vacuum processing chamber
- 112 second vacuum processing chamber
- 114 third vacuum processing chamber
- 116 fourth vacuum processing chamber
- 200 vacuum processing chamber
- 203 load lock chamber
- 205 transfer chamber
- 206 wafer cassette
- 207 pre-alignment stage
- 208 arm
- 213 vacuum-side gate valve
- 214 atmosphere-side gate valve
- 300 processing apparatus
- 302 processing chamber
- 304 processing chamber
- 306 transfer arm
- 308 transfer arm
- 310 load lock chamber
- 312 load lock chamber
- 314 gate valve
- 316 gate valve
- 318 gate valve
- 320 gate valve
- 324 transfer chamber
- 328 transfer arm
- 330 auxiliary chamber
- 332 gate valve
- 334 gate valve
- 336 gate valve
- 338 wafer cassette
- 340 wafer cassette
- 342 wafer cassette
- 346 stage

BEST MODE FOR CARRYING OUT THE INVENTION

The following is a detailed explanation of the embodiments of the present invention, given in reference to the drawings. It is to be noted that the same reference numerals are assigned to components achieving substantially identical functions in the following explanation and the attached drawings to preclude the necessity for a repeated explanation thereof.

FIRST EMBODIMENT

Figure 2:
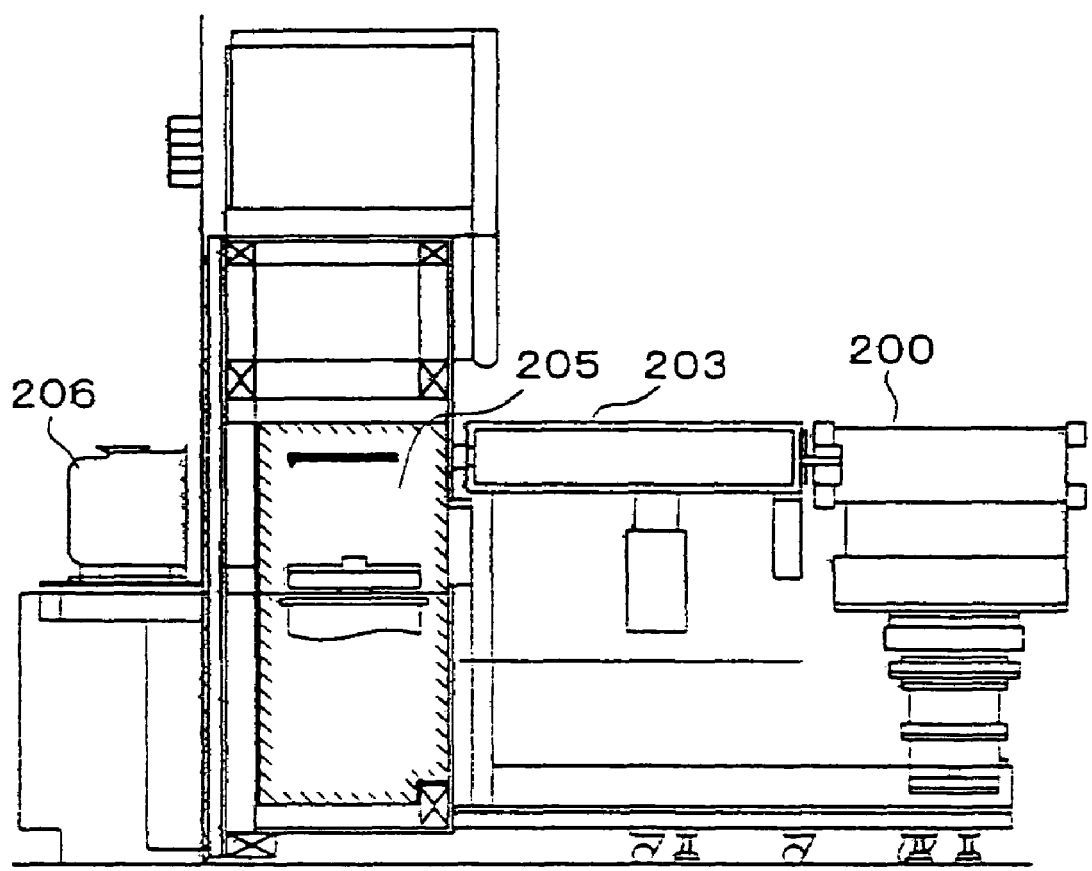
FIG. 2 is a schematic side elevation of the semiconductor processing apparatus shown in FIG. 1.

First, in reference to FIGS. 1 and 2, the structure adopted in the processing apparatus achieved in the first embodiment of the present invention is briefly explained. FIGS. 1 and 2 respectively are a schematic plan view and a schematic side elevation of a processing apparatus that etches a workpiece, i.e., a semiconductor wafer. This processing apparatus includes a vacuum processing chamber 200 where a semiconductor wafer W is etched and a load lock chamber 203 provided as a auxiliary vacuum chamber. The load lock chamber 203 is detachably mounted at a side surface of a transfer chamber 205 constituted as a rectangular common transfer passage.

At another side surface of the transfer chamber 205, a plurality of wafer cassettes 206 are provided as housing means at each of which tens of wafers W are set over a predetermined interval, with a pre-alignment stage 207 provided at one end of the transfer chamber 205. Namely, at the front of the transfer chamber 205, a cassette stage providing load ports for the plurality of wafer cassettes 206 placed thereupon is set. Inside each wafer cassette 206, which includes a lid and can be sealed tightly, a large stack of wafers is supported over numerous levels.

An arm 208, which carries a wafer W into/out of a wafer cassette 206 is provided at the transfer chamber 205 so as to be allowed to move freely along the length of the transfer chamber 205. A single wafer W is taken out of a wafer cassette 206 by the arm 208, the wafer W is carried onto the pre-alignment stage 207 and is pre-aligned. The wafer W is then held firmly and carried into the load lock chamber 203 and is finally transferred into the vacuum processing chamber 200.

Inside the vacuum processing chamber 200, the wafer W is etched, and then the processed wafer W is carried out to the load lock chamber 203 where it is transferred to the arm 208. The processed wafer is then returned to the wafer cassette 206 by the arm 208.

A vacuum-side gate valve 213 is provided at a portion of the vacuum processing chamber 200 where it is linked with the load lock chamber 203, whereas an atmosphere-side gate valve 214 is provided where the load lock chamber 203 is linked with the transfer chamber 205.

Figure 3:
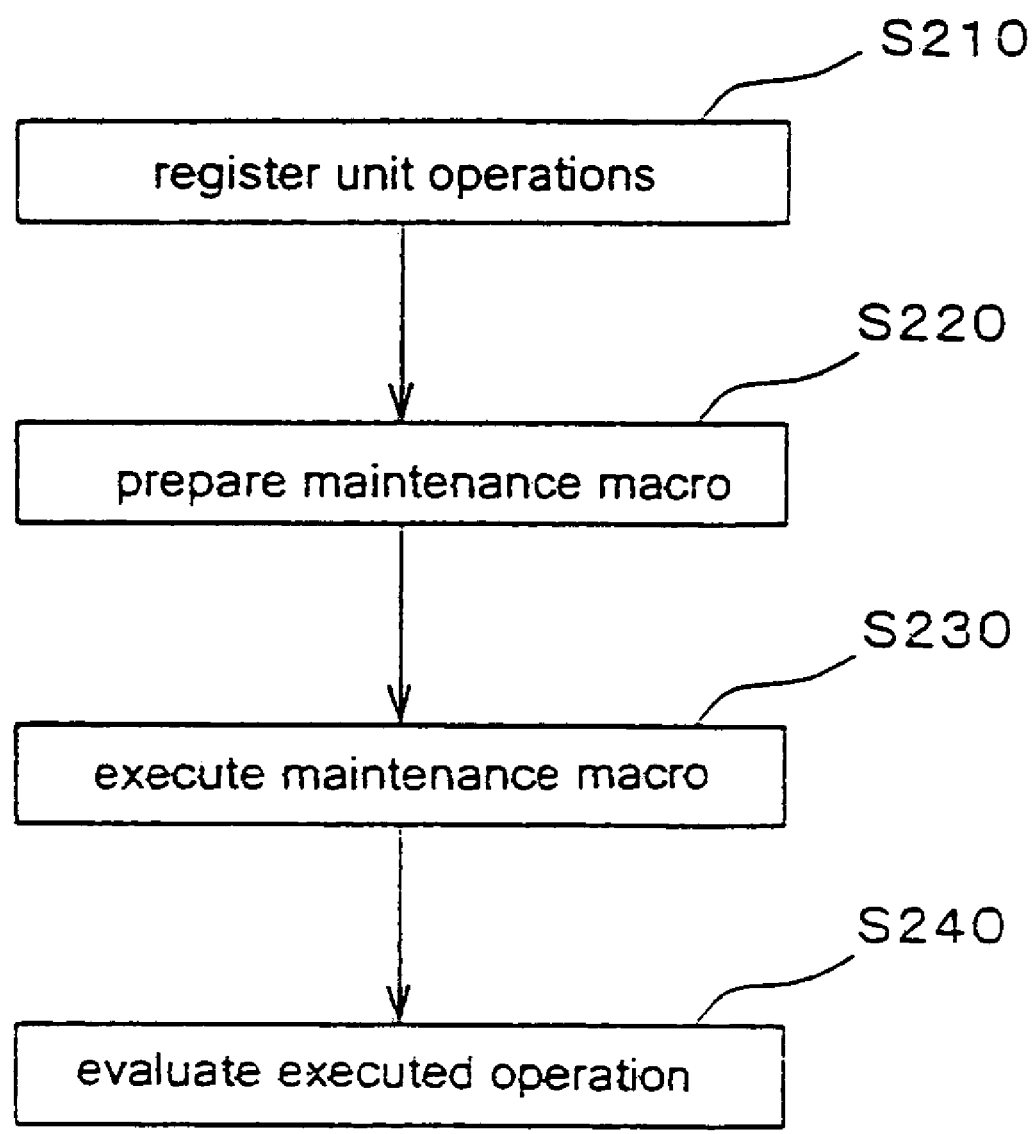
FIG. 3 presents a flowchart of the maintenance method achieved in the first embodiment of the present invention.

Next, in reference to FIG. 3, the processing apparatus maintenance method achieved in the embodiment is explained. FIG. 3 presents a flowchart of the procedure of the processing apparatus maintenance method achieved in an embodiment of the present invention. First, unit operations corresponding to part of the processing apparatus undergoing the maintenance work are registered in advance (S210). The unit operations registered in the step vary for different parts and, for instance, the open operation alone or the close operation of a gate constitutes a unit operation. It is desirable that the unit operations registered in this step include a part inspection operation and a part initialization operation.

Next, a maintenance macro file is prepared by combining the unit operations registered in S210 as appropriate to be executed in a sequence operation and/or a parallel operation (S220). In this context, the term "sequence operation" refers to a sequential operation during which the unit operations are sequentially executed whereas the term "parallel operation" refers to a parallel operation in which unit operations are executed concurrently. It is desirable to prepare a loop macro for repeating a unit operation for the part as necessary in this step. Such a loop macro is effective when it is necessary to conduct an endurance test. In addition, it is desirable to prepare the macro file which includes a target monitoring operation macro to be used to monitor whether or not the control value has been achieved in a part unit operation.

Next, the maintenance macro file prepared in S220 is executed to conduct maintenance (S230). At this time, a reservation for the execution of a plurality of maintenance macro files may be made as well. In addition, while the execution of a maintenance macro file is in progress, the execution may be canceled, temporarily halted or resumed.

The processing apparatus data and any related data obtained during the maintenance macro file execution are saved as a file. Based upon these data, the sequence operations and/or the parallel operation that has been executed is evaluated (S240).

Figure 4:
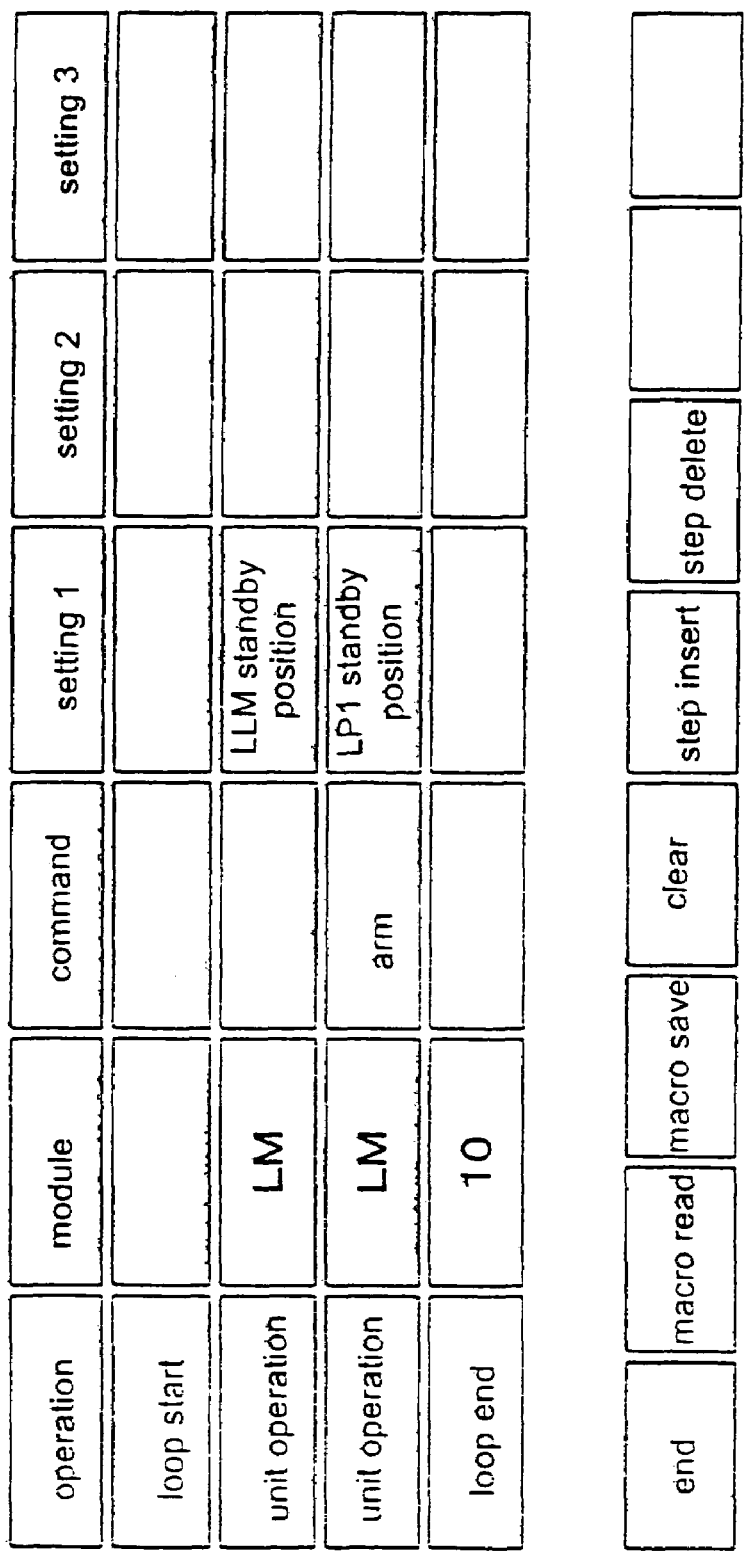
FIG. 4 presents an example of a macro editor screen that may be used in the first embodiment of the present invention.

FIG. 4 presents an example of a macro editor screen that may be used when preparing the macro file in S220. The "LM" under the heading "module" on the screen is an abbreviation of a loader module (loading/unloading chamber). Under the heading "command", a part that is actually operated is indicated and, in this example, "arm" is indicated. Under the heading "setting 1" the value set for the part indicated in the heading "command" is indicated. In this example the "LLM standby position" refers to the movement of the arm to the side opposite the front of the load lock chamber whereas the "LP1 standby position" refers to the movement of the arm to the side opposite the front of the first load port.

Figure 5:
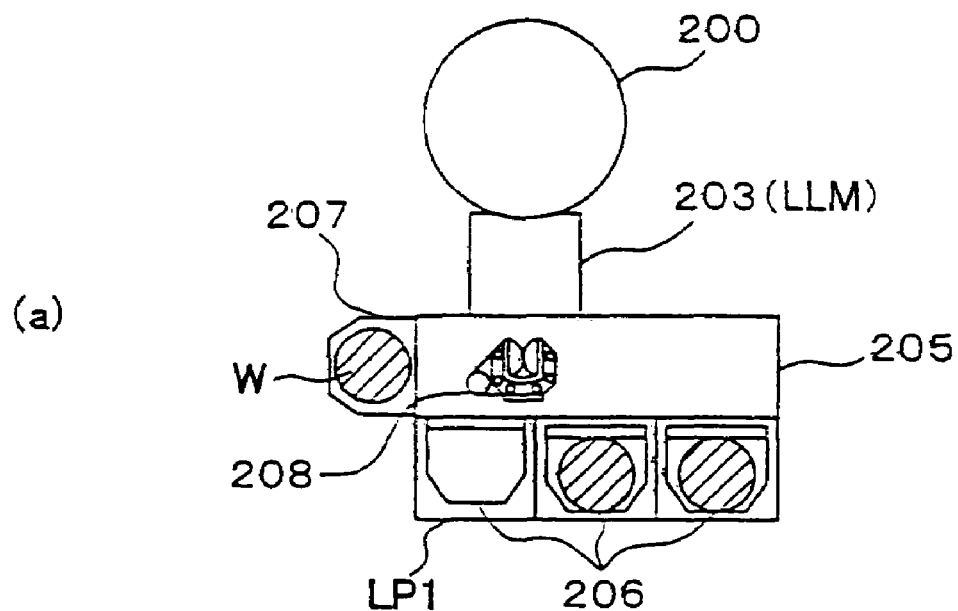
FIG. 5 illustrates states of arm movement observed in the first embodiment of the present invention.
Figure 5:
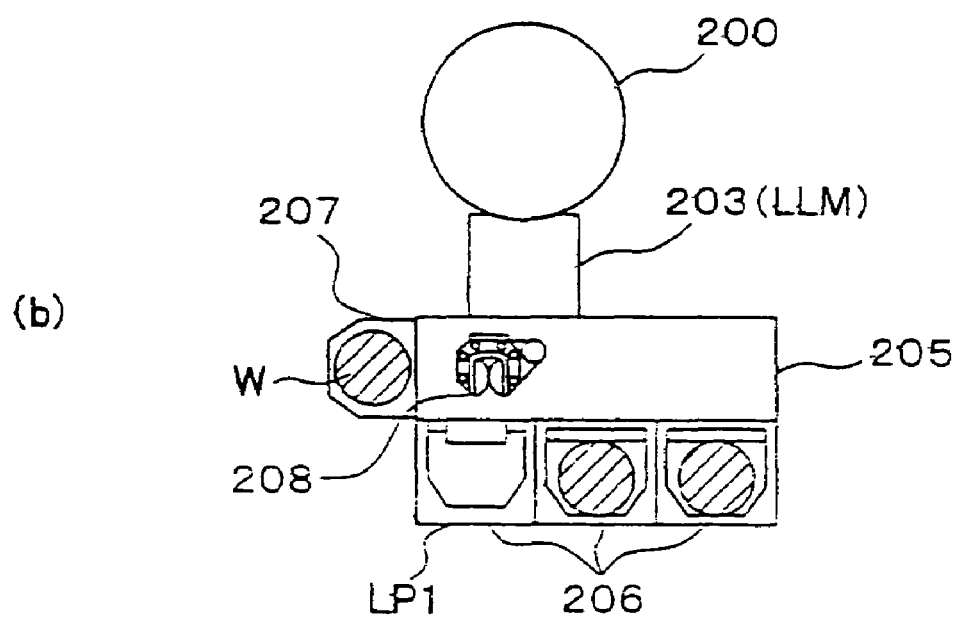

In other words, a processing apparatus operation that is a combination of a unit operation through which the arm moves to the side opposite the front of the load lock chamber and a unit operation through which the arm moves to the side opposite the front of the first load port is described. The value 10 in the screen indicates the number of times these unit operations are executed repeatedly. Accordingly, by executing this macro, the operations described above are repeated 10 times. FIGS. 5(a) and 5(b) respectively illustrate of the states of the arm when it has moved to the LLM standby position and the LPI standby position. In FIG. 5, the same reference numerals are assigned components identical to or similar to those in FIG. 1 to preclude the necessity for a repeated explanation of these components.

The macro thus prepared can be saved as a file by operating a macro save button at the bottom of the screen. The macro file thus saved can be called up as necessary by operating a macro read button. In addition, the macro file which has been called up can be edited as well. For instance, a step can be inserted or deleted by operating a step insert button or a step delete button to set a desired operation. By utilizing such a macro editor, unit operations can be combined freely. Furthermore, when the contents of processing apparatus operation tests or the details regarding the acquisition of processing apparatus inspection data are partially modified, too, an updated macro file can be created easily by simply calling up the existing macro file and partially editing it.

As described above, in the embodiment, a macro file having part operations combined as appropriate is described and a desired processing apparatus operation can be executed in conformance to the macro file. As a result, the adjustment and inspection process can be automated. Since an updated macro file can easily be created by calling up the existing macro file and partially editing it even when the contents of the operation tests or the details of the data to be obtained are modified, it is not necessary to prepare a new program from scratch or to perform a manual operation. In addition, an endurance test or the like can be executed by writing a loop macro for repeating a unit operation and executing this loop macro.

While an explanation has been given above on an example in which the present invention is adopted in the arm operations, the present invention is not limited to this example and it is obvious that maintenance can be performed for the part by writing a macro file and executing the macro file.

As explained in detail above, a macro constituted of part operations in an arbitrary combination is described in advance and by executing this macro, a desired processing apparatus operation can be executed in the embodiment. Even when the contents of the processing apparatus operation tests or the details of processing apparatus inspection data acquisition are partially modified, updated macro file can be prepared easily simply by calling up the macro file and partially editing it, and thus it is not necessary to prepare a new program from scratch or to perform the manual operation.

SECOND EMBODIMENT

Next, in reference to FIGS. 6~9, the processing apparatus automatic inspection method and the processing apparatus automatic resetting method achieved in the second embodiment of the present invention are explained in detail.

Figure 6:
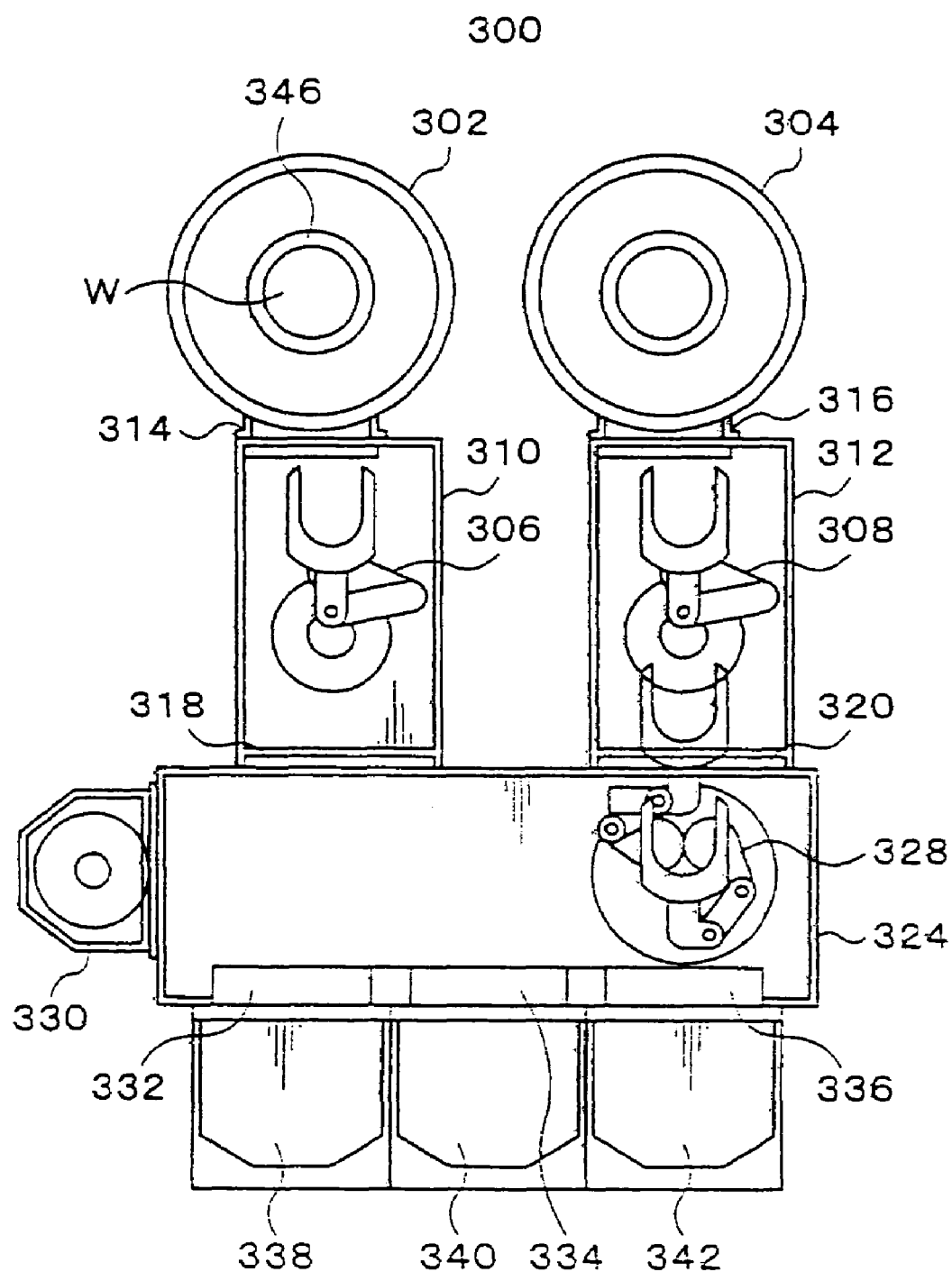
FIG. 6 is a sectional view taken along the horizontal direction, schematically illustrating the structure of a processing apparatus in which the automatic inspection method and the automatic resetting method achieved in a second embodiment of the present invention may be adopted.
Figure 7:
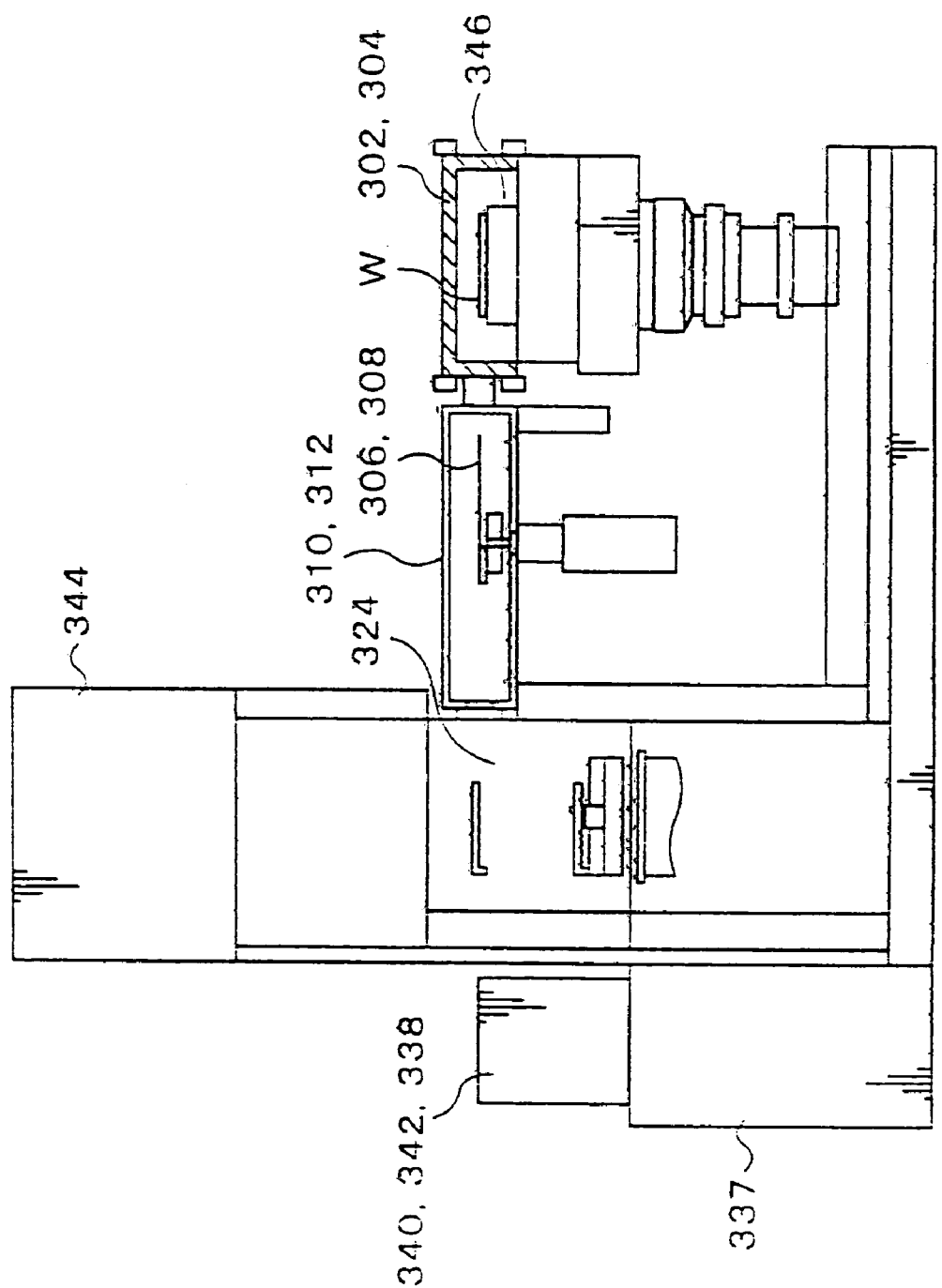
FIG. 7 is a sectional view taken along the vertical direction, schematically illustrating the structure of a processing apparatus in which the automatic inspection method and the automatic resetting method achieved in the second embodiment of the present invention may be adopted.

First, in reference to FIGS. 6 and 7, the structure of a processing apparatus in which the automatic inspection method and the automatic resetting method in the embodiment may be adopted is briefly explained.

A processing apparatus 300 in the figures is a multi-chamber processing apparatus capable of simultaneously executing multiple types of processing, and includes a plurality of processing chambers 302 and 304 in which semiconductor wafers, i.e., workpieces (hereafter simply referred to as wafers) are etched or the like provided side by side. Load lock chambers 310 and 312, which are auxiliary vacuum chambers respectively having transfer arms 306 and 308 constituting transfer means, are each connected at one end thereof to the corresponding processing chamber 302 or 304 via a gate valve 314 or 316.

One side surface of a transfer chamber 324 ranging over the longer side of the transfer chamber 324 constituting a common transfer passage, is connected to the other ends of the load lock chambers 310 and 312 via gate valves 318 and 320 respectively. The transfer chamber 324 in the figures, which assumes a substantially rectangular shape, includes a transfer arm 328 constituting a transfer means that can move freely along the direction in which its longer side extends. In addition, at a side surface ranging over the short side of the transfer chamber 324, an auxiliary chamber 330 is connected. At the auxiliary chamber 330, an in-line inspection device capable of conducting a wafer particle inspection and a wafer film thickness inspection is provided in addition to a pre-alignment stage used for wafer pre-alignment. It is to be noted that while the auxiliary chamber 330 is used both as the pre-alignment chamber and the in-line inspection chamber in the example presented in the figure, separate chambers may be provided for pre-alignment and in-line inspection, instead.

A particle inspection device realized as the in-line inspection device measures the size of a particle based upon the intensity of light by detecting the light radiated onto the wafer surface from a laser light source and irregularly reflected off the particle. It also performs measurement over the entire wafer surface while laser light and the wafer move relative to each other to ascertain the exact position of the particle on the wafer. It is desirable that the particle inspection device have the performance capability to detect a particle which is a 0.2 μm or larger in size and, more desirably, 0.1 μm or larger in size even when a pattern is formed on the wafer or films are formed on the wafer over a plurality of layers. A film thickness inspection device is realized as the in-line inspection device that measures the thickness of a film based upon the change observed in the light intensity between the light from the upper surface and the light from the lower surface of the film by irradiating laser light or LED light onto the wafer surface. The film thickness inspection device should be capable of measuring the thickness of the films at the outermost surface among a plurality of layers of film formed on the wafer at a reproduction accuracy within a range of ±5 Å and more desirably within ±2 Å. Data obtained at such an in-line inspection device can be monitored on the processing apparatus operation screen and also are stored in memory at the control unit to be utilized as multivariate analysis data for processing apparatus status evaluation.

A plurality of wafer cassettes, e.g., three wafer cassettes 338, 340 and 342, which are set on a cassette stage are connected to the other side surface of the transfer chamber 324 ranging over its longer side. The wafer cassettes 338, 340 and 342 are each capable of housing a plurality of wafers over predetermined intervals along the vertical direction. In addition, a fine coil unit 344 is installed above the transfer chamber 324 to supply clean air into the transfer chamber.

The operation of the processing apparatus 300 described above is now briefly explained. First, the transfer arm 328 moves inside the transfer chamber 324 and takes out a wafer W from the selected loading wafer cassette 338. Next, the wafer W is moved to the auxiliary chamber 330 where it is pre-aligned, and then it is transferred to the transfer arm 306 in the selected load lock chamber 310. The wafer W is placed onto a stage 346 inside the processing chamber 302 by the transfer arm 306. Subsequently, after the wafer W undergoes a specific type of processing, e.g., plasma processing, the wafer W is unloaded to the selected unloading wafer cassette 342 via the load lock chamber 310 and the transfer chamber 324 in an almost the reverse order, and thus, the sequence of the processing ends.

It is necessary to conduct specific types of inspections and maintenance work after implementing the processing such as that described above over a predetermined length of time or for a predetermined number of lots. The following is a detailed explanation of the method of automatically inspecting the processing apparatus and the method of automatically resetting the processing apparatus from the maintenance mode achieved in the embodiment.

Figure 8:
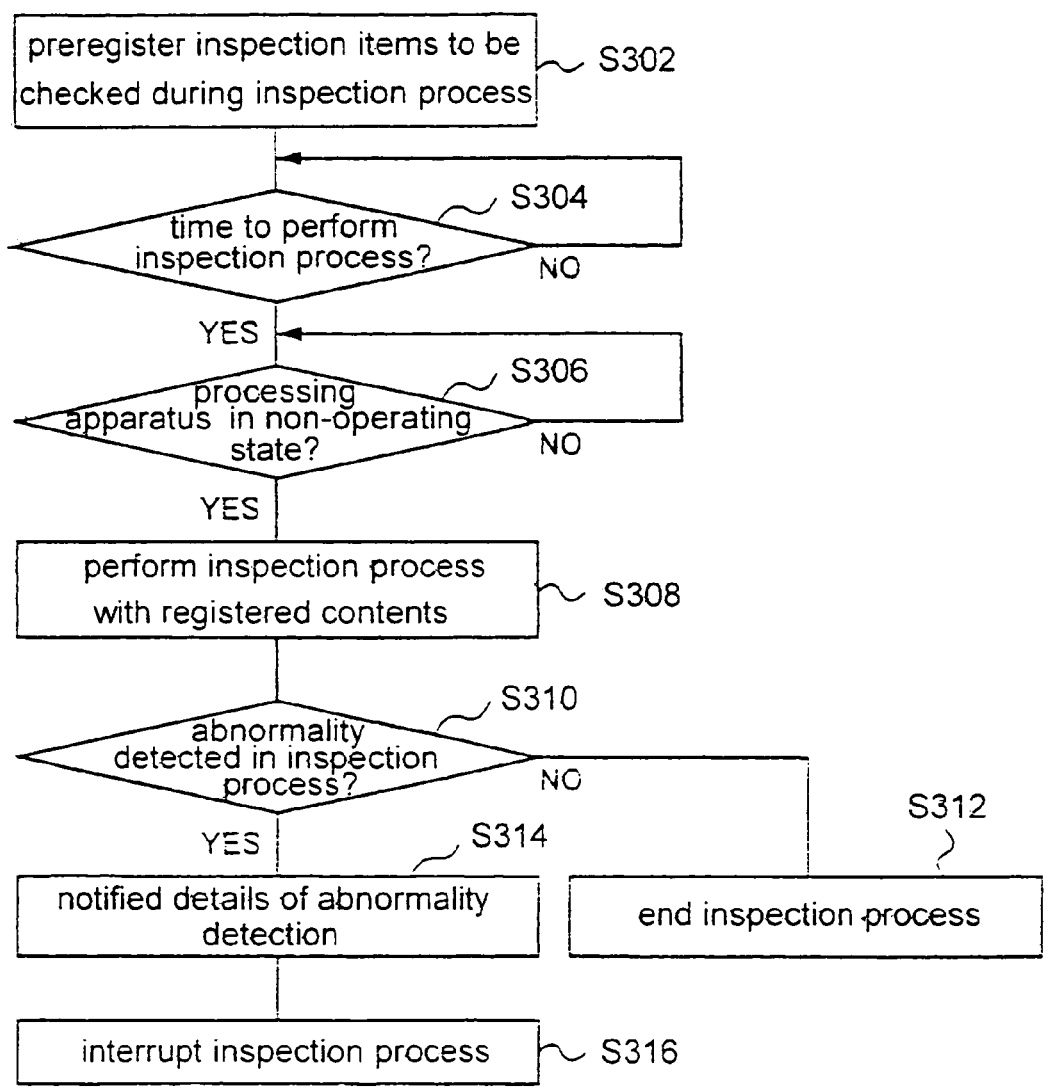
FIG. 8 presents a flowchart of the procedure of the automatic inspection method of achieved in the second embodiment of the present invention.

The processing apparatus automatic inspection method in the embodiment is first explained. As shown in FIG. 8, inspection items to be checked while inspecting the processing apparatus are registered in advance (S302). The inspection items may be registered by writing an inspection macro in advance and assigning various parameters in the macro.

While any inspection items can be set freely for the registration, the items that may be registered include the following; a virtual volumetric capacity measurement of the process modules (processing chambers), pressure gauge 0 inspection, pressure gauge zero calibration, a pressure gauge sensitivity/linearity inspection, flowmeter zero point inspection, flowmeter zero point calibration, flowmeter sensitivity/stability inspection, flowmeter flow verify, flowmeter self-diagnosis, back cooling gas flow gauge calibration, process module evacuation inspection, load lock module evacuation inspection, process module leak inspection, load lock module leak inspection, discharge inspection, high-frequency power supply system inspection plasma light emission inspection, particle inspection, film thickness inspection, dummy transfer inspection and test wafer process in inspection.

Among these inspection items, the particle inspection, the film thickness inspection, the dummy transfer inspection, the test wafer processing inspection and the like need to be conducted by actually operating the processing apparatus to process a dummy wafer or a test wafer end than inspecting the processed the and the wafer or test wafer with the in-line inspection device or the like. In addition, the parameters for the abnormality decision-making criteria with regard to the individual inspection items may be input as well. Furthermore, a few statistical parameters indicating the processing apparatus status may be ascertained by performing a multivariate analysis of the measurement values corresponding to all the inspection items or a plurality of inspection items obtained over time, and based upon these statistical parameters, an integrated processing apparatus abnormality decision-making criterion or an integrated post-maintenance resetting completion decision-making criterion may be set. By automating these overall decision-making performed by the operating personnel in the related art, the regular inspection process and the post-maintenance resetting process can be automated as well.

In addition, an execution trigger maybe set as a parameter registered in an automatic inspection macro. The execution trigger sets the timing with which the inspection macro is executed, over a specific time interval (in units of minutes, hours, days, weeks, months or the like), over an interval corresponding to a specific number of lots or wafers, or over a time interval representing a specific length of discharge time.

After registering the inspection items in step S302 as described above, the processing apparatus is engaged in normal operation. Then, as the time point set in advance as the execution trigger for conducting the inspection process arrives (S304), the operating state of the processing apparatus is verified (S306). If it is decided that the processing apparatus is not engaged in operation in this verification step (S306), the inspection process is automatically executed to check the registered inspection items immediately (S308). However, if it is decided in the verification step (S306) that the processing apparatus is engaged in operation, the inspection process is automatically executed to check the registered items after the processing apparatus operation ends, i.e., after the wafer is unloaded or after the processing of the current lot ends. It is to be noted that an inspection item may be skipped by specifying the item in the inspection macro if it is decided in the verification step (S306) that the processing apparatus is engaged in operation.

In addition, a time point proceeding lot processing, a time point following the lot processing or time points proceeding and following the lot processing may be specified as the execution trigger for inspection items such as the particle inspection and the film thickness measurement that necessitate the use of the in-line inspection device and inspection items such as the dummy transfer conducted to inspect the transfer system that require a significant length of time to complete, so as to ensure that these inspections are executed before or after the processing of the lot and that the inspections of items not requiring much time to check can be mainly executed during the lot processing.

During the inspection step (S308), if no abnormality is detected through the decision made based upon the abnormality decision-making criterion set for a given inspection item (S310), other inspection items are checked in sequence in a similar manner. Ultimately, integrated inspection results are obtained based upon processing apparatus abnormality decision-making criteria for a few statistical parameters ascertained through a multivariate analysis of the measurement values corresponding to all the inspection items or a plurality of inspection items obtained over time, and if the integrated inspection results indicate that the processing apparatus does not manifest any abnormality, it is decided that the inspections have been completed and the sequence of the inspection process ends (S312). If, on the other hand, an abnormality is detected during the inspection step (S308), the operating personnel or the like is notified of the details of the detected abnormality (S314) and the inspection process is interrupted if necessary (S316) to await an instruction from the operating personnel. However, the inspection process may continue uninterrupted as long as the detected abnormality is very slight.

It is to be noted that while any of various decision-making methods may be adopted during the inspection step (S308) and, more specifically, for the final abnormality detection achieved through the integrated decision made on the processing apparatus status, a more reliable abnormality detection can be achieved through multivariate analysis such as a principal component analysis. In a principal component analysis, a single set or a few sets of statistical data indicating the overall characteristics manifesting in numerous types of inspection data, which are referred to as the principal components, are used to enable an accurate evaluation of the processing apparatus status simply by checking the values of the principal components. In more specific terms, the inspection data corresponding to all the inspection items are obtained a plurality of times in advance by setting the processing apparatus in a normal state and a principal component analysis is performed on the plurality of sets of inspection data thus obtained to determine individual values used to determine, for instance, a first principal component. Then, inspection data corresponding to all the inspection items which are obtained in an actual inspection process are incorporated in the formula for determining the first principal component to ascertain the value of the first principal component representing the results of the actual inspection process. This first principal component value is then compared with the first principal component value representing the normal state, and if the difference is within a predetermined range, the processing apparatus can be judged to be free of abnormality. It is to be noted that the same number of principal components as the number of inspection items can be obtained, e.g., n principal components can be ascertained if there are n inspection items and, generally speaking, the first principal component has the highest degree of reliability.

As explained above, the completion of the inspection process is automatically determined in an integrated manner through the multivariate analysis in the processing apparatus automatic inspection method in the embodiment, and thus, even inspection items such as those that need to be checked by employing the in-line inspection device provided in the processing apparatus and cannot be checked automatically with ease in the related art, can be checked automatically. In addition, since the operating state of the processing apparatus is verified when executing the inspection process, the inspection process can be automatically executed with as much flexibility as that afforded in an inspection process manually performed by operating personnel.

Figure 9:
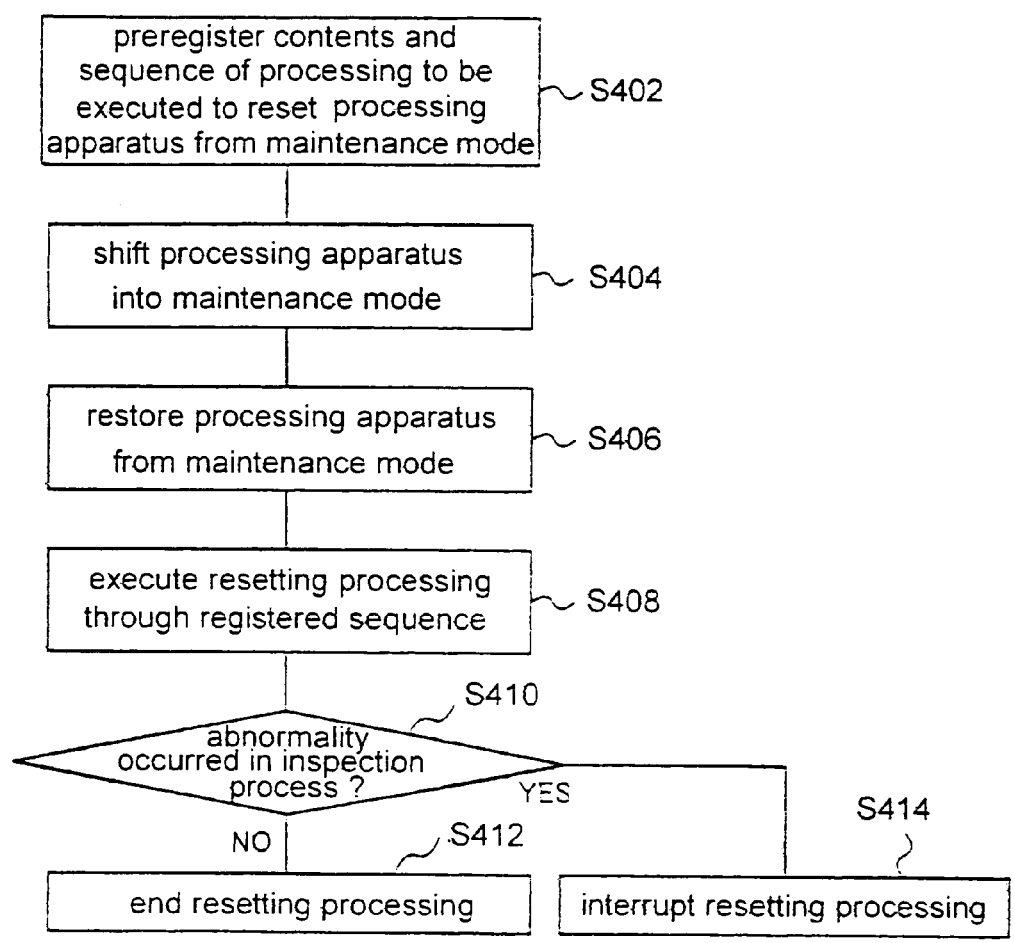
FIG. 9 presents a flowchart of the procedure of the automatic resetting method in the second embodiment of the present invention.

Next, in reference to FIG. 9, the processing apparatus automatic resetting method achieved in the embodiment is explained. As explained earlier, it is necessary to perform maintenance on the processing apparatus on a regular basis or whenever necessary. When the processing apparatus is reset to the normal operating mode after a specific maintenance process is completed, the processing apparatus needs to be inspected on specific inspection items through specific procedures. In the related art, the operating personnel must perform various inspections in sequence to check the individual inspection items one at a time when resetting the processing apparatus following the maintenance process. However, by adopting the processing apparatus automatic resetting method achieved in the embodiment, the resetting process, including the integrated decision-making as to whether or not the maintenance has been completed that is performed by the operating personnel in the related art, for resetting the processing apparatus from the maintenance mode to the normal operating mode, during which in-line inspections such as a particle inspection and a film thickness measurement may be conducted, can be automated.

In order to execute an automatic reset through the method of resetting processing apparatus achieved in the embodiment, it is necessary to pre-register the contents and the sequence of the processing to be executed when the processing apparatus is reset from the maintenance mode to the normal operating mode (S402). The inspection items may be registered by writing an inspection macro in advance and assigning various parameters in the macro as in the processing apparatus automatic inspection method explained earlier.

While any inspection items can be set freely for the registration, as in the processing apparatus automatic inspection method explained earlier, the items that may be registered include the following; a virtual volumetric capacity measurement of the process module (processing chamber), a pressure gauge zero inspection, a pressure gauge zero calibration, a pressure gauge sensitivity/linearity inspection, a flowmeter zero point inspection, a flowmeter zero point calibration, a flowmeter sensitivity/stability inspection, a flowmeter flow verify test, a flowmeter self-diagnosis, a back cooling gas pressure gauge zero calibration, a process module evacuation inspection, a load lock module evacuation inspection, a process module leak inspection, a load lock module leak inspection, a discharge inspection, a high-frequency power supply system inspection, a plasma light emission inspection, a particle inspection, a film thickness inspection, a dummy transfer inspection and a test wafer processing inspection.

Among these inspection items, the particle inspection, the film thickness inspection, the dummy transfer inspection, the test wafer processing inspection and the like need to be conducted by actually operating the processing apparatus to process a dummy wafer or a test wafer and then inspecting the processed dummy wafer or test wafer with the in-line inspection device or the like. In addition, the parameters for the abnormality decision-making criteria with regard to the individual inspection items may be entered as well. Furthermore, a few statistical parameters indicating the processing apparatus status may be ascertained by performing a multivariate analysis of the measurement values corresponding to all the inspection items or a plurality of inspection items obtained over time, and based upon these statistical parameters, an integrated processing apparatus abnormality decision-making criterion or an integrated post-maintenance resetting completion decision-making criterion may be set. By automating these overall decision-making processes performed by the operating personnel in the related art, the regular inspection process and the post-maintenance resetting process can be automated as well.

With the inspection items pre-registered as described above, the processing apparatus undergoes scheduled maintenance or spot maintenance (S404). After the maintenance process is duly completed, the processing apparatus is reset from the maintenance mode (S406) through the automatic resetting method achieved in the embodiment. The resetting process is automatically executed (S408) in conformance to the contents and the procedures of the inspections registered in advance in the registration step (S402).

In the resetting step (S408), a decision is made as to whether or not an abnormality has occurred with regard to each inspection item in conformance to the corresponding abnormality decision making criterion (S410). During the abnormality decision-making step (S410), if no abnormality is detected through the decision made based upon the abnormality decision-making criterion set for a given inspection item, other inspection items are checked in sequence in a similar manner. Ultimately, integrated inspection results are obtained based upon the processing apparatus abnormality decision-making criteria for a few statistical parameters ascertained through a multivariate analysis of the measurement values corresponding to all the inspection items or a plurality of inspection items obtained over time, and if the integrated inspection results indicate that the processing apparatus does not manifest any abnormality, it is decided that the inspections have been completed and the operation shifts to the normal operating mode (S412) after ending the resetting processing. If, on the other hand, an abnormality is detected during the abnormality decision-making step (S410), the operating personnel or the like is notified of the details of the detected abnormality and the resetting process is interrupted if necessary (S414) to await and instruction from the operating personnel. However, the resetting process may continue uninterrupted as long as the detected abnormality is not serious.

As explained above, the completion of the resetting process is automatically judged in an integrated manner through the multivariate analysis in the processing apparatus automatic resetting method in the embodiment, and thus, even post-maintenance resetting items such as those that need to be checked by employing the in-line inspection device provided in the processing apparatus and cannot be checked automatically with ease in the related art, can be checked automatically.

By adopting the processing apparatus automatic inspection method and the processing apparatus automatic resetting method achieved in the embodiment, integrated decisions can be automatically made with respect to the completions of the inspection process and the resetting process through multivariate analysis. As a result, the regular inspection process and the resetting process for restoring the processing apparatus from the maintenance mode to the normal operating mode, which may necessitate the use of an in-line inspection device provided in the processing apparatus and cannot be automated with ease in the related art, can be executed automatically. In addition, the reliability of these processes improves and, at the same time, the onus on the operating personnel is greatly reduced.

THIRD EMBODIMENT

Figure 10:
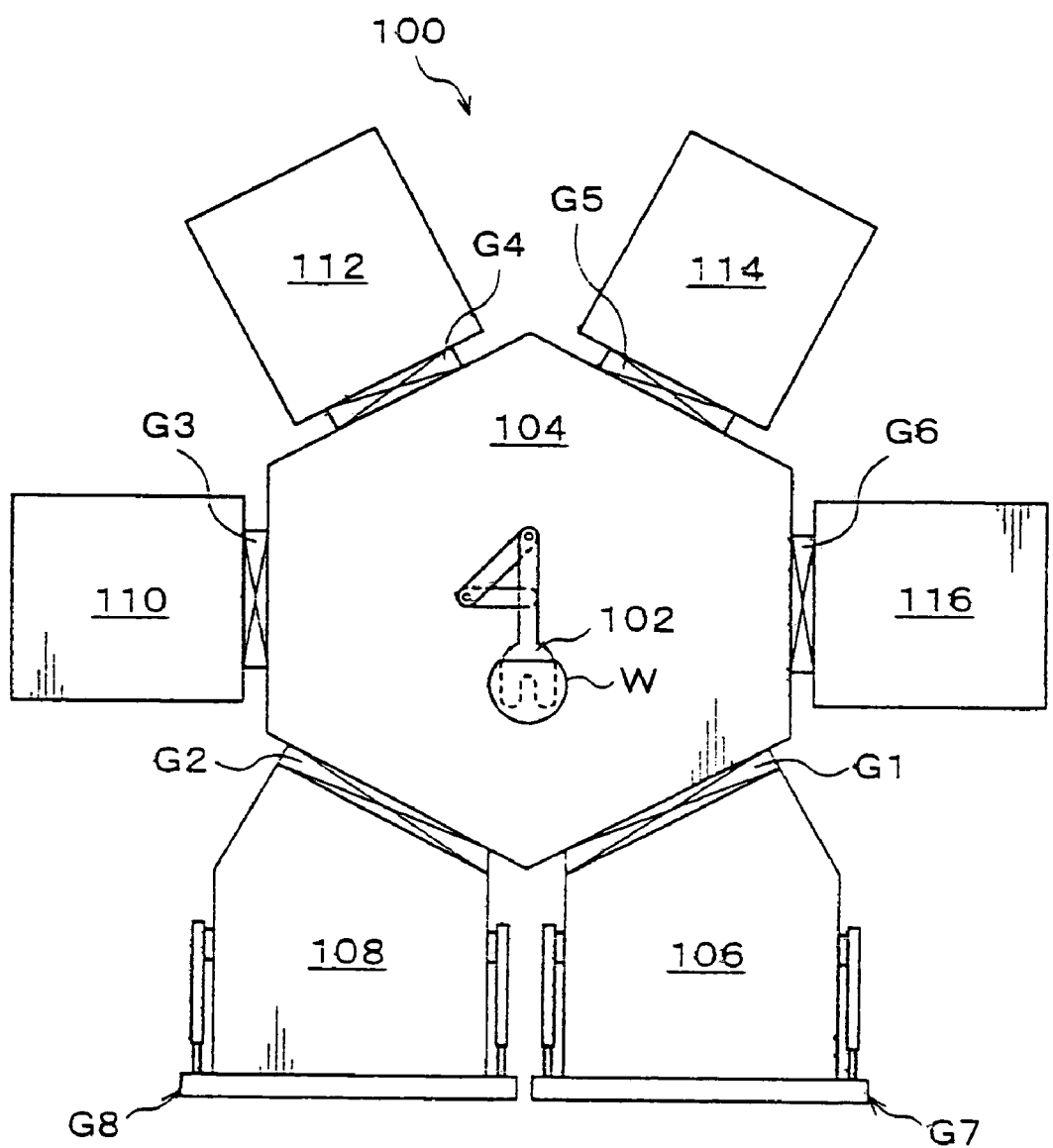
FIG. 10 is a schematic plan view of the semiconductor processing apparatus achieved in a third embodiment of the present intention.
Figure 11:
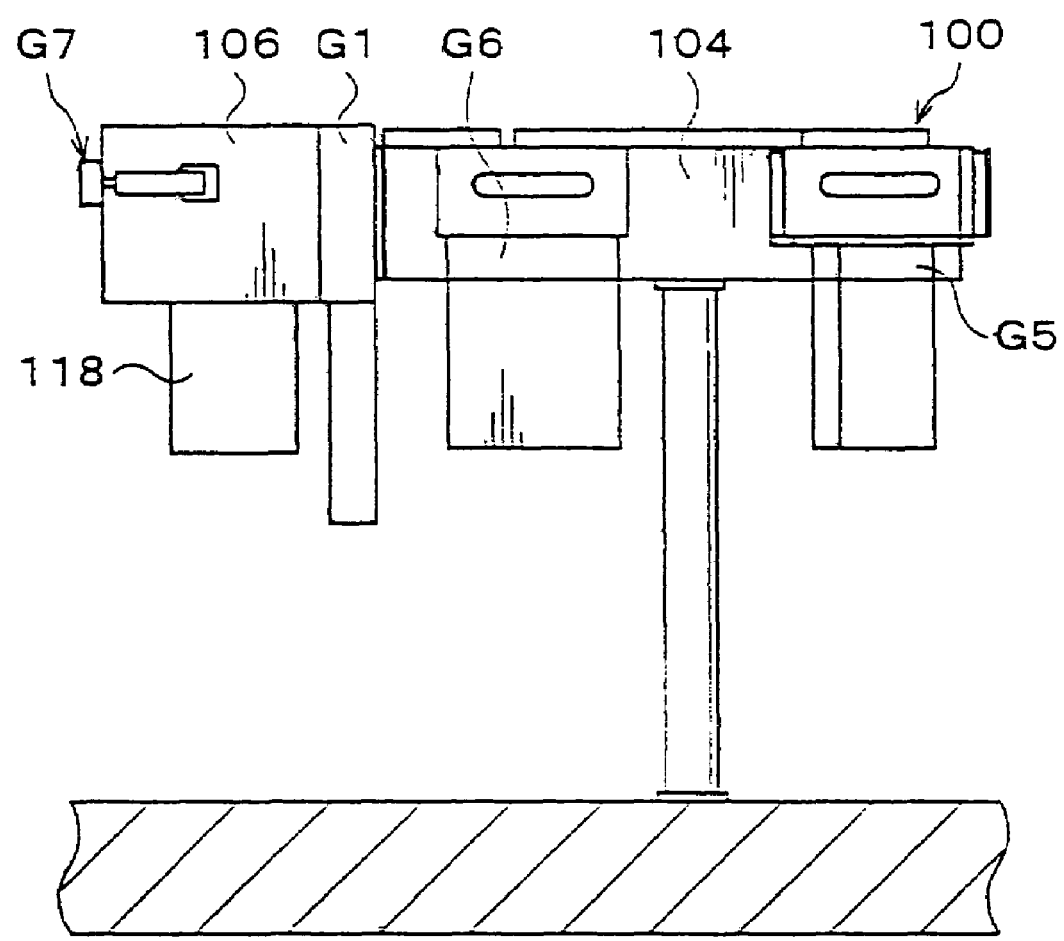
FIG. 11 is a schematic side elevation of the semiconductor processing apparatus shown and FIG. 10.

Next, in reference to FIGS. 10 and 11, the overall configuration of a processing apparatus 100 achieved in the third embodiment is explained. FIGS. 10 and 11 are respectively a schematic plan view and a schematic side elevation of a multi-chamber type processing apparatus. In the processing apparatus 100, first and second load lock chambers 106 and 108 and first~fourth vacuum processing chambers 110, 112, 114 and 116 where various types of processing are implemented on semiconductor wafers W are provided via first~sixth gate valves G1~G6 around a vacuum transfer chamber 104 having a transfer are 102 which transfers workpieces such as the semiconductor wafers w.

The first and second load lock chambers 106 and 108 are used to load/unload the semiconductor wafers W between the vacuum transfer chamber 104 and a wafer carrier (not shown) inside which the pressure is kept at the atmospheric pressure level while the pressure of the atmosphere inside the vacuum transfer chamber 104 is sustained at a lowered level. Pressure regulating mechanism 118 each constituted of a vacuum pump and a gas supply system, which are provided at the bottoms of the first and second load lock chambers 106 and 108 set the pressures within the first and second load lock chambers 106 and 108 at a desirable level. In addition the atmosphere side openings of the first and second load lock chambers 106 and 108 are sealed by seventh and eighth gate valves G7 and G8 respectively so as to be opened/closed freely. The first~eighth gate valves G1~G8 are opened/closed by moving the valve elements constituting the individual gate valves up and down with driving mechanisms (not shown). It is to be noted that FIG. 11 illustrates the processing apparatus 100 in a state in which the first~fourth vacuum processing chambers 110, 112, 114 and 116 are disengaged.

Figure 12:
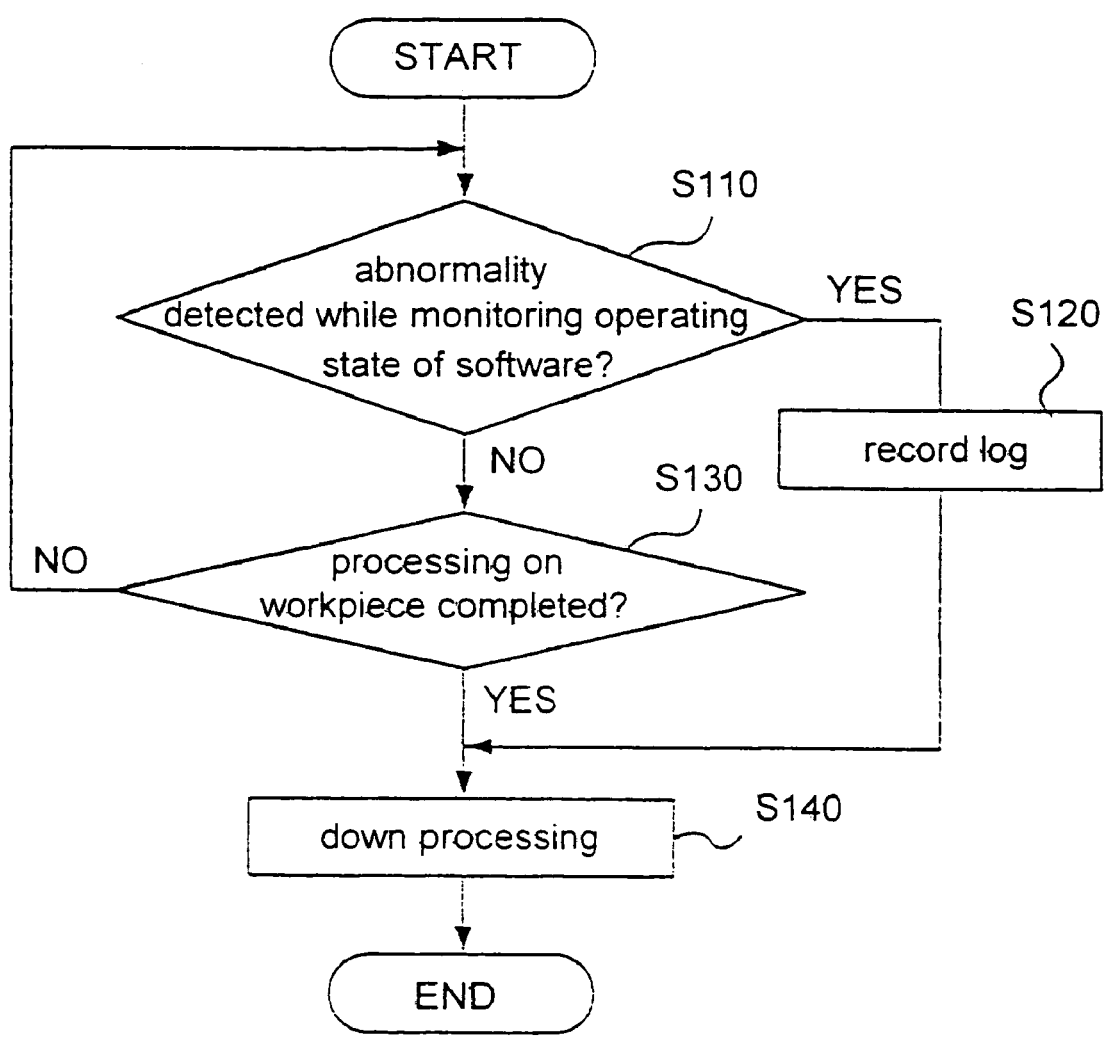
FIG. 12 presents a flowchart of the procedure of the method of self-diagnosing the software used to drive the processing apparatus achieved in the third embodiment of the present invention.

FIG. 12 presents a flowchart in reference to which the method of self-diagnosing the software used to drive the processing apparatus achieved in the embodiment of the present invention is explained. As the processing apparatus drive starts, the operating state of the software used to drive the processing apparatus is monitored in real time to diagnose whether or not any abnormality has occurred (S110). The items to be checked through the diagnosis include the memory state, the CPU load state, the queue state, the number of open files, the network communication load, the stack state and the resource state.

The diagnosis may be performed by, for instance, setting in advance a change rate, a change pattern, a threshold value and the like for each of these items and comparing the actual change rate, change pattern, value and the like achieved during the operation with these settings. By comparing the preset values and the actual values, it is possible to detect that the processing apparatus is approaching a control disabled state, that a control disabled state is imminent or the like. The change rate, the change pattern, the threshold value and the like are parameters that can be changed freely.

If it is decided through the diagnosis performed in S110 that no abnormality has occurred, the processing on the workpiece is continuously executed, and a decision as to whether or not the workpiece processing has been completed is made (S130). If the processing has been completed, the processing apparatus is stopped (S140). If, on the other hand, it is decided through the diagnosis in S110 that an abnormality has occurred, a log of the diagnosis item with regard to which the abnormality has occurred is recorded (S120). Then, the processing apparatus is stopped (S140).

For instance, if the stack usage is diagnosed to have reached a point close to the limit, it is decided that an abnormality has occurred. Under these circumstances, continuous application of the high-frequency power for plasma generation may lead to a failure of the processing apparatus as well as damage to the product. Accordingly, if such a state is detected, relevant information is communicated through a physical signal line connecting the CPUs, an interrupt signal and the like, to execute a stop operation, i.e., an operation for turning off the high-frequency power, during the interrupt processing.

It is also decided that an abnormality has occurred if the network load is diagnosed to be nearing the limit range. In this case, if a sufficient length of time is left to effect a normal processing stop for the product currently undergoing the processing or if the use of the internal means for communication is enabled, relevant information is communicated through internal communication and an internal interrupt to execute a stop operation, i.e., an operation for stopping the process, during the interrupt processing.

As another example, if the change rate of the CPU load is diagnosed to have manifested a sudden increase, too, it is decided that an abnormality has occurred. In this case, if a sufficient length of time is left to disallow in advance the processing of products yet to be processed, relevant information is communicated through internal communication to execute a stop operation such as disallowing the loading of the next wafer or disallowing loading of the next lot, by having the receiver-side task (the processing routine) interpret the information.

As described above, the operating state of the software used to drive the processing apparatus is monitored in real-time and the processing apparatus is stopped after recording a log if an abnormality has occurred in the embodiment. Thus, it becomes possible to prevent an abnormality in the operating state of the software from causing an abnormality in the processing apparatus. As a result, the wafer products are not damaged either. In addition, by recording the log, the state in which the abnormality has occurred can be ascertained and, ultimately, the cause of the abnormality can be pinpointed.

As described in detail above, by adopting the embodiment, the occurrence of an abnormality in the processing apparatus can be prevented so as to avert any damage to workpieces, i.e., the eventual products. Thus, an improvement in the yield of workpieces undergoing the processing is achieved and, at the same time, the throughput can be maintained at a specific level.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

INDUSTRIAL APPLICABILITY

The present invention may be adopted in a method of self-diagnosing software used during a process of manufacturing semiconductor devices and, more specifically, it may be adopted in a method of self-diagnosing software used to drive a processing apparatus that implements processing such as etching and film forming on workpieces that may be semiconductor wafers or liquid crystal display substrates.

What is claimed is:

1. A method of automatically inspecting a processing apparatus that processes a workpiece, comprising:
    a registration step in which at least inspection items to be checked in an inspection process and a time point for the inspection process are registered in advance;
    a verification step in which the operating state of said processing apparatus is verified when the registered inspection time point arrives;
    an inspection step in which the inspection process to check the registered inspection items is automatically and immediately executed if said processing apparatus is determined to be in a non-operating state, or after the operation in said verification step of said processing apparatus ends, if said processing apparatus is determined to be engaged in operation in said verification step; and
    a decision-making step in which a decision is made as to whether or not the inspection process has been completed.

2. A method of automatically inspecting a processing apparatus according to claim 1, wherein:
    said processing apparatus is provided with an inline inspection device and the inspection items include an inspection item to be checked by utilizing said inline inspection device.

3. A method of automatically inspecting a processing apparatus according to claim 1, wherein:
    said inspection process includes an abnormality detection response step, in which, upon detecting an abnormality, the maintenance personnel are notified of details of the abnormality and the inspection process is interrupted.

4. A method of automatically inspecting a processing apparatus according to claim 1, wherein:
    the inspection items include at least one of:
    a target vacuum inspection, a leak inspection, a flow rate inspection, a discharge inspection, a high-frequency power supply system inspection, a plasma light emission inspection, a particle inspection, an etching characteristics inspection, a test transfer and a test wafer processing inspection.

5. A method of automatically inspecting a processing apparatus according to claim 1, wherein the inspection step comprises at least one of:
    detecting an abnormality during the inspection process; and
    deciding whether or not the inspection process has been completed through a multivariate analysis.

* * * * *